United States Patent
Soeno

(10) Patent No.: US 9,947,752 B2
(45) Date of Patent: Apr. 17, 2018

(54) SEMICONDUCTOR DEVICE HAVING PROTECTION FILM WITH RECESS

(71) Applicant: TOYOTA JIDOSHA KABUSHIKI KAISHA, Toyota-shi, Aichi-ken (JP)

(72) Inventor: Akitaka Soeno, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/601,180

(22) Filed: May 22, 2017

(65) Prior Publication Data

US 2018/0026109 A1 Jan. 25, 2018

(30) Foreign Application Priority Data

Jul. 21, 2016 (JP) ................... 2016-143263

(51) Int. Cl.
 *H01L 29/41* (2006.01)
(52) U.S. Cl.
 CPC .................... *H01L 29/41* (2013.01)
(58) Field of Classification Search
 CPC ... H01L 29/0657; H01L 29/41; H01L 21/288; H01L 21/283; H01L 24/03; H01L 24/05; H01L 23/562; H01L 2224/05011; H01L 2224/03418; H01L 23/3107; H01L 24/06; H01L 24/29; H01L 24/32; H01L 24/33; H01L 24/83; H01L 24/92

USPC .................... 257/623, 773; 438/652
 See application file for complete search history.

(56) References Cited

U.S. PATENT DOCUMENTS

| 6,255,737 | B1 * | 7/2001 | Hashimoto | H01L 21/768 257/208 |
| 8,963,315 | B2 * | 2/2015 | Fukuoka | H01L 23/48 257/181 |
| 9,362,219 | B2 * | 6/2016 | Kawase | H01L 23/3735 |
| 2015/0097275 | A1 * | 4/2015 | Imai | H01L 21/283 257/623 |

FOREIGN PATENT DOCUMENTS

| JP | H05-136298 A | 6/1993 |
| JP | 2010-272711 A | 12/2010 |

* cited by examiner

Primary Examiner — Alexander Oscar Williams
(74) Attorney, Agent, or Firm — Oliff PLC

(57) ABSTRACT

A semiconductor device may include a semiconductor substrate, a first metal film covering a surface of the semiconductor substrate; a protection film covering a peripheral portion of a surface of the first metal film; and a second metal film covering a range extending across a center portion of the surface of the first metal film and a surface of the protection film, wherein a recess may be provided in the surface of the protection film, and a part of the second metal film may be in contact with an inner surface of the recess.

2 Claims, 7 Drawing Sheets

SEMICONDUCTOR DEVICE HAVING PROTECTION FILM WITH RECESS

TECHNICAL FIELD

A technique disclosed herein relates to a semiconductor device.

BACKGROUND

A semiconductor device of Japanese Patent Application Publication No. 2010-272711 includes a semiconductor substrate, a first metal film (emitter electrode film) covering a surface of the semiconductor substrate, a protection film (passivation film) covering a peripheral portion of a surface of the first metal film, and a second metal film (additional electrode) covering a range extending across a center portion of the surface of the first metal film and a surface of the protection film.

SUMMARY

In the semiconductor device of Japanese Patent Application Publication No. 2010-272711, a boundary between the second metal film and the protection film exists on the first metal film. When the semiconductor device generates heat, each of the first metal film, the second metal film, and the protection film thermally expands. Since the second metal film has a liner expansion coefficient different from that of the protection film, the first metal film under the second metal film has an expansion rate different from that of the first metal film under the protection film. Due to this, a high stress is applied to the first metal film under the boundary between the second metal film and the protection film, and thus a crack is likely to occur in the first metal film at that position.

Meanwhile, in general, a stress is applied to a metal film on a semiconductor substrate toward a center of the metal film. Therefore, in Japanese Patent Application Publication No. 2010-272711 as well, a stress is applied to the first metal film and the second metal film toward respective centers of the metal films. That is, the stress is applied to the first metal film and the second metal film in a direction separating those metal films from the protection film. When a crack occurs in the first metal film as described above, the force acting in the direction along which the first and second metal films are separated from the protection film concentrates on an interface between the second metal film and the protection film. Thereby, there may be a case where the second metal film is detached from the protection film, and the first and second metal films slide toward their centers. As a result, an abnormality occurs in an electrical property of the semiconductor device.

Therefore, a semiconductor device in which a first metal film and a second metal film are less likely to slide is disclosed herein.

The semiconductor device disclosed herein may comprise a semiconductor substrate; a first metal film covering a surface of the semiconductor substrate; a protection film covering a peripheral portion of a surface of the first metal film; and a second metal film covering a range extending across a center portion of the surface of the first metal film and a surface of the protection film. A recess may be provided in the surface of the protection film, and a part of the second metal film may be in contact with an inner surface of the recess.

In the above-described semiconductor device, a part of the second metal film is arranged in the recess provided in the surface of the protection film. According to this configuration, even when a force acts on the second metal film in a direction separating the second metal film from the protection film, the second metal film is held by the protection film due to the part of the second metal film arranged in the recess. Therefore, the second metal film is less likely to be detached from the protection film. Due to this, the second metal film, and the first metal film being in contact with the second metal film are less likely to slide.

DETAILED DESCRIPTION

Figure 1:
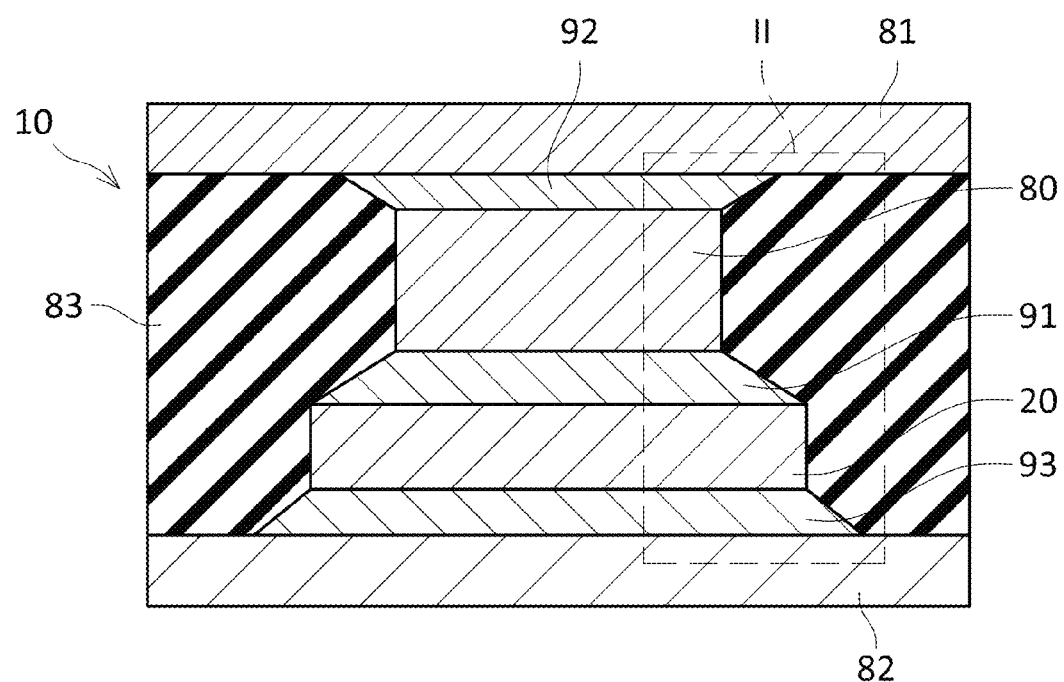
FIG. 1 is a cross sectional view of a semiconductor device according to an embodiment.

As shown in FIG. 1, a semiconductor device 10 according to an embodiment comprises a semiconductor element 20, a heatsink block 80, a front surface side radiator plate 81, a rear surface side radiator plate 82, and sealing resin 83. The semiconductor element 20 includes a semiconductor substrate, a front surface electrode, and a rear surface electrode. It should be noted that the front surface electrode and the rear surface electrode are not shown in FIG. 1. The heatsink block 80 is fixed to the front surface electrode of the semiconductor element 20 via a solder layer 91. The front surface side radiator plate 81 is fixed to a front surface of the heatsink block 80 via a solder layer 92. The rear surface side radiator plate 82 is fixed to the rear surface electrode of the semiconductor element 20 via a solder layer 93. The sealing resin 83 covers a lower surface of the front surface side radiator plate 81, the heatsink block 80, the semiconductor element 20, and an upper surface of the rear surface side radiator plate 82.

Figure 2:
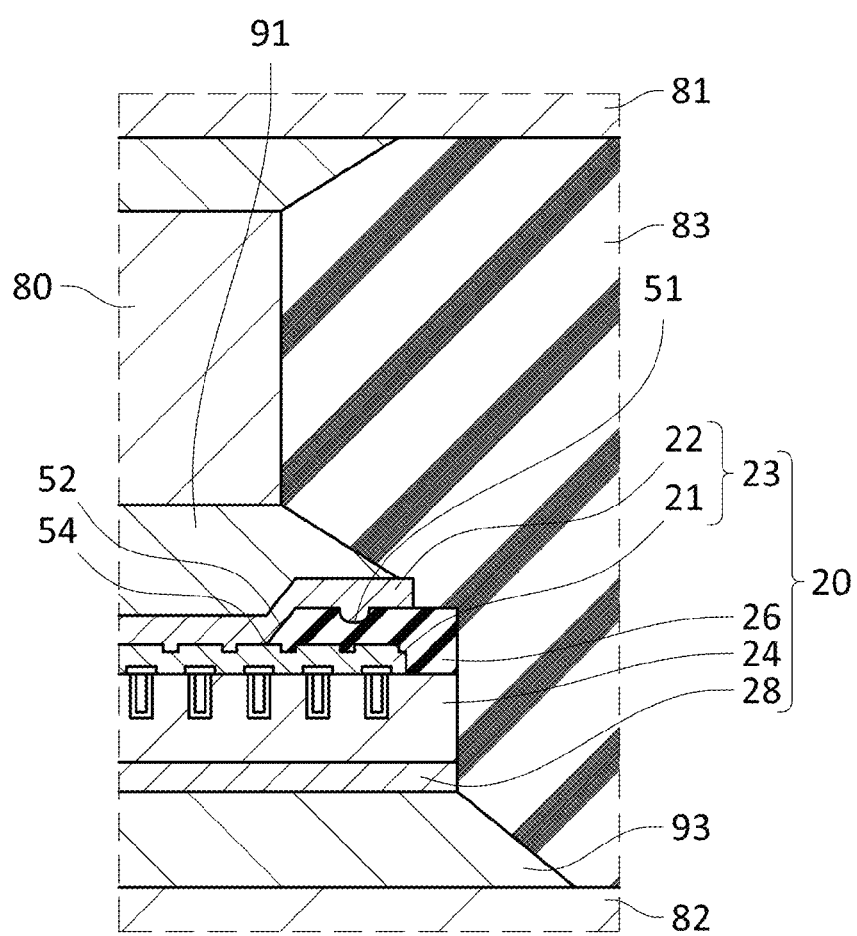
FIG. 2 is an enlarged view of a range II in FIG. 1.

As the semiconductor element 20, for example, an IGBT (Insulated Gate Bipolar Transistor), a MOSFET (Metal Oxide Semiconductor Field Effect Transistor), a diode, or the like can be used. The semiconductor element 20 generates heat while operating. As shown in FIG. 2, the semiconductor element 20 includes a semiconductor substrate 24, a front surface electrode 23, a protection film 26, and a rear surface electrode 28.

The semiconductor substrate 24 has a plate-like shape, and is constituted of silicon (Si), silicon carbide (SiC), or the like, for example. A liner expansion coefficient of the semiconductor substrate 24 is 3 to 5 ppm.

The front surface electrode 23 and the protection film 26 are provided above the semiconductor substrate 24. The front surface electrode 23 includes first metal films 21 and a second metal film 22.

Figure 3:
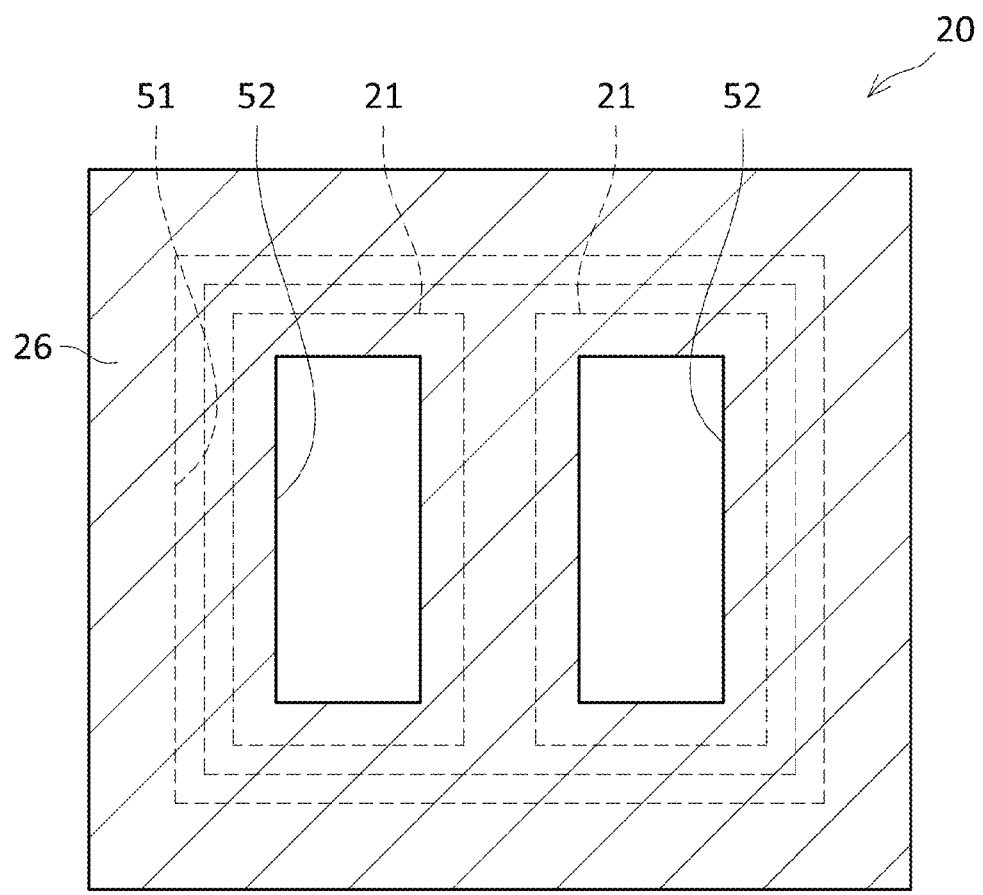
FIG. 3 is a top view of a semiconductor element provided in the semiconductor device according to the embodiment.

FIG. 3 is a top view of the semiconductor element 20. It should be noted that the second metal film 22 is not shown in FIG. 3. Further, in FIG. 3, a range covered by the protection film 26 is hatched. As shown in FIG. 3, two first metal films 21 are provided on a front surface of the semiconductor substrate 24. Each of the first metal films 21 partially covers the front surface of the semiconductor substrate 24. The first metal films 21 have electrical conductivity, and are constituted of aluminum alloy (AlSi), for example. A liner expansion coefficient of the first metal films 21 is approximately 23 ppm.

The protection film 26 is constituted of resin, and has an insulation property. The protection film 26 is constituted of polyimide, for example. A liner expansion coefficient of the protection film 26 is approximately 35 ppm. As shown in FIGS. 2 and 3, the protection film 26 covers a portion of the front surface of the semiconductor substrate 24 which is not covered by the first metal films 21, and a peripheral portion of a front surface of each first metal film 21. The protection film 26 includes openings 52 above the respective first metal films 21. A center portion of the front surface of each first metal film 21 is arranged within a corresponding one of the openings 52. Therefore, the center portion of the front surface of each first metal film 21 is not covered by the protection film 26. A recess 51 is provided in a surface of the protection film 26. The recess 51 extends in a ring shape so as to surround the two openings 52 (i.e., the center portions of the respective first metal films 21).

As shown in FIG. 2, the second metal film 22 covers a range extending across the center portion of the front surface of each first metal film 21 and the front surface of the protection film 26. Therefore, the second metal film 22 covers side surfaces of the openings 52 of the protection film 26. Due to this, on each first metal film 21, a boundary 54 between the second metal film 22 and the protection film 26 exists. The second metal. film 22 has electrical conductivity; and is constituted of nickel (Ni), for example. A liner expansion coefficient of the second metal film 22 is approximately 13 ppm. The second metal film 22 covers an entirety of the front surface of the protection film 26 in a range where the recess 51 is provided. A part of the second metal film 22 is arranged in the recess 51. The recess 51 is filled with the second metal film 22 over its entire region in a direction along which the recess 51 extends. The second metal film 22 arranged in the recess 51 is in contact with an inner surface of the recess 51 (i.e., its bottom surface and side surface). An entirety of the front surface of the second metal film 22 is covered by the solder layer 91.

When the semiconductor device 10 generates heat, each of the first metal films 21, the second metal film 22, and the protection film 26 thermally expands. The liner expansion coefficient of the protection film 26 is greater than the liner expansion coefficient of the second metal film 22. Therefore, an expansion rate of the first metal films 21 under the protection film 26 is greater than an expansion rate of the first metal films 21 under the second metal film 22. Due to this, a high stress is applied to the first metal films 21 under the boundary 54 between the second metal film 22 and the protection film 26, and a crack is likely to occur in the first metal films 21 at these positions.

Meanwhile, a stress is constantly applied to the first metal films 21 and the second metal film 22 toward respective centers of the metal films. The first metal films 21 and the second metal film 22 are deposited on the semiconductor substrate 24 by sputtering or vapor deposition in a high-temperature of around 300 degrees Celsius. When being deposited, stress is hardly applied to the first metal films 21 and the second metal film 22. During cooling after the deposition, the first metal films 21, the second metal film 22, and the semiconductor substrate 24 shrink. At this occasion, since the liner expansion coefficient of the semiconductor substrate 24 is smaller than the liner expansion coefficients of the first metal films 21 and the second metal film 22, the first metal films 21 and the second metal film 22 do not sufficiently shrink, and stress is generated toward the center of each metal film. Since an operating temperature of the semiconductor device 10 is equal to or lower than the above-mentioned deposition temperature, stress is constantly applied to the first metal films 21 and the second metal film 22 toward the respective centers thereof. That is, stress is applied to the first metal films 21 and the second metal film 22 in a direction separating these metal films from the protection film 26. The higher the temperature of the semiconductor device 10 is, the smaller the stress applied to the first metal films 21 and the second metal film 22 becomes, and the lower the temperature of the semiconductor device 10 is, the greater the stress becomes. Depending on usage environment and conduction state of the semiconductor device 10, the temperature of the semiconductor device 10 changes, and metal fatigue that leads to a crack accumulates in the first metal films 21.

Further, the entirety of the front surface of the second metal film 22 is covered by the solder layer 91. The solder layer 91 is formed in a high-temperature melting state on the front surface of the second metal film 22, and then shrinks while cooling down and solidifying. Therefore, the solder layer 91 also causes the stress toward the centers of the first metal films 21 and the second metal film 22 (i.e., the stress acting in the direction separating these metal films from the protection film 26) to be generated in the first metal films 21 and the second metal film 22.

When a crack occurs in the first metal film(s) 21 under the boundary 54 as described above, the force acting in the direction separating the first metal films 21 and the second metal film 22 from the protection film 26 concentrates on an interface between the second metal film 22 and the protection film 26. However, in the semiconductor device 10 of the present embodiment, a part of the second metal film 22 is arranged in the recess 51 provided in the front surface of the protection film 26. According to such a configuration, even when the force acts on the second metal film 22 in the direction separating the second metal film 22 from the protection film 26, the second metal film 22 is held by the protection film 26 due to the part of the second metal film 22 arranged in the recess 51. Therefore, the second metal film 22 is less likely to be detached from the protection film 26 and is less likely to slide therefrom. Due to this, the first metal films 21 and the second metal film 22 can be suppressed from sliding, and high reliability of the semiconductor device 10 can be realized.

An example of a manufacturing method of the semiconductor device 10 will be described hereinbelow. It should be noted that this manufacturing method has a characterizing feature in forming the recess 51, thus a process related to forming the recess 51 will be described below but explanations of the other processes will be omitted.

Figure 4:
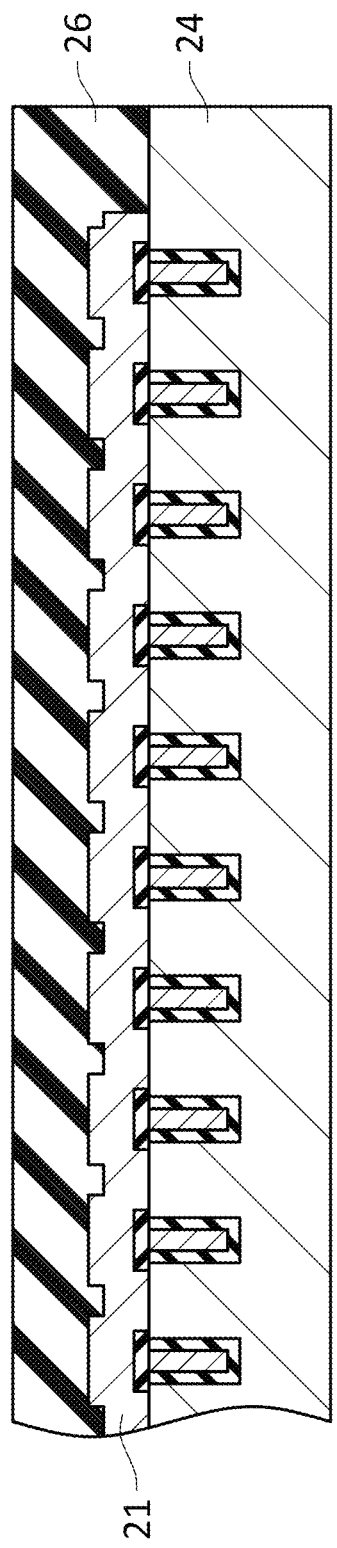
FIG. 4 is a view for explaining a manufacturing method of the semiconductor device according to the embodiment and showing a cross sectional view of the semiconductor device when a first metal film and a protection film are deposited on a semiconductor substrate.
Figure 5:
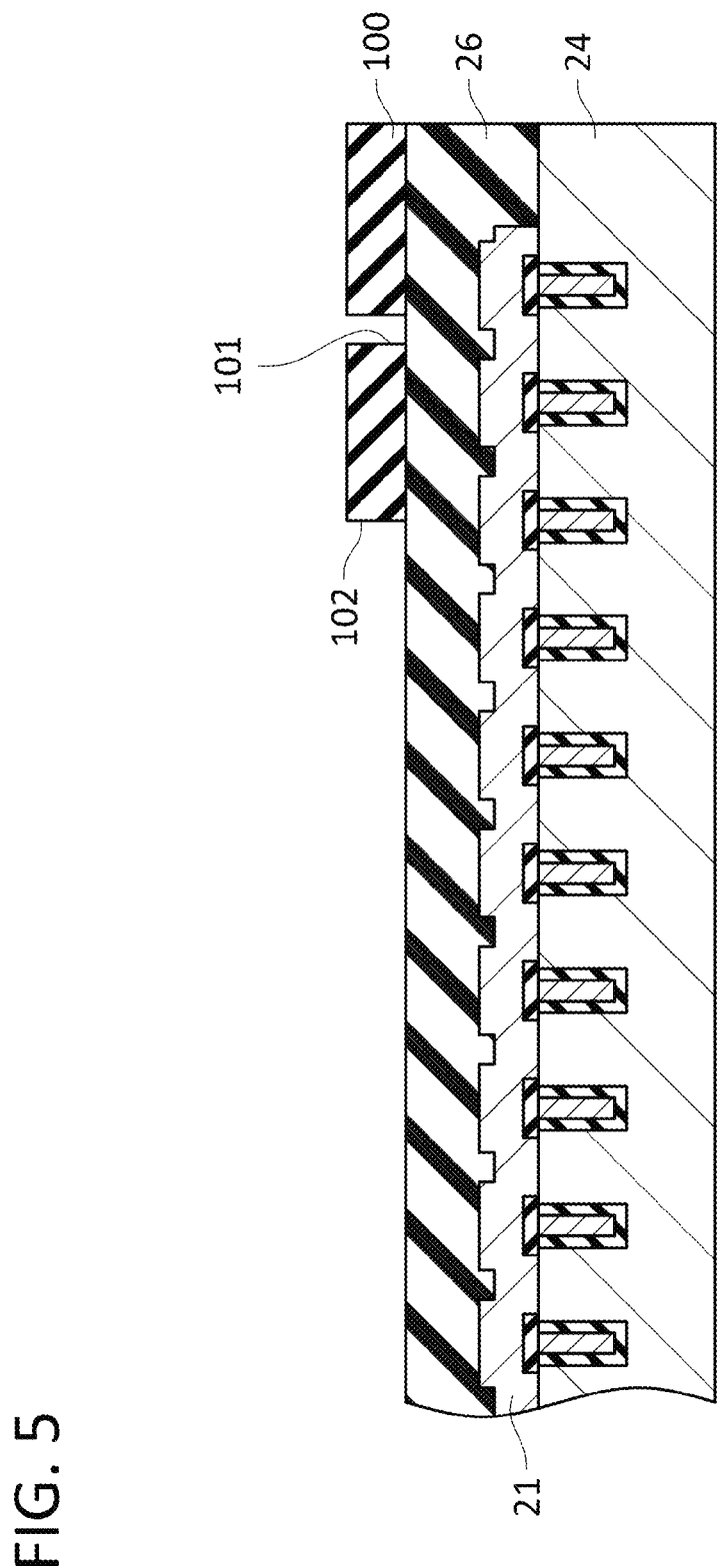
FIG. 5 is a view for explaining the manufacturing method of the semiconductor device according to the embodiment and showing the cross sectional view of the semiconductor device when a resist is formed on the protection film.
Figure 6:
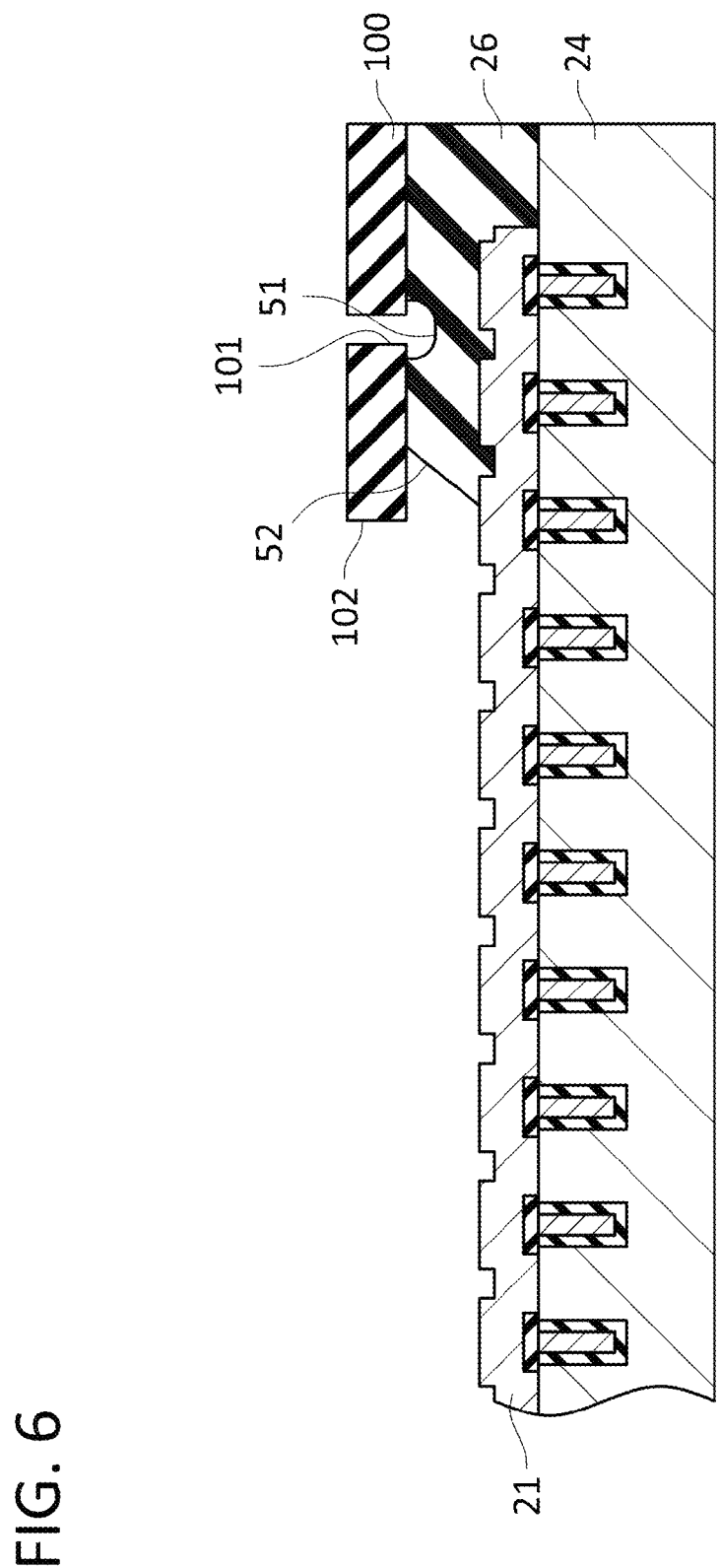
FIG. 6 is a view for explaining the manufacturing method of the semiconductor device according to the embodiment and showing the cross sectional view of the semiconductor device when the protection film is isotropically etched.
Figure 7:
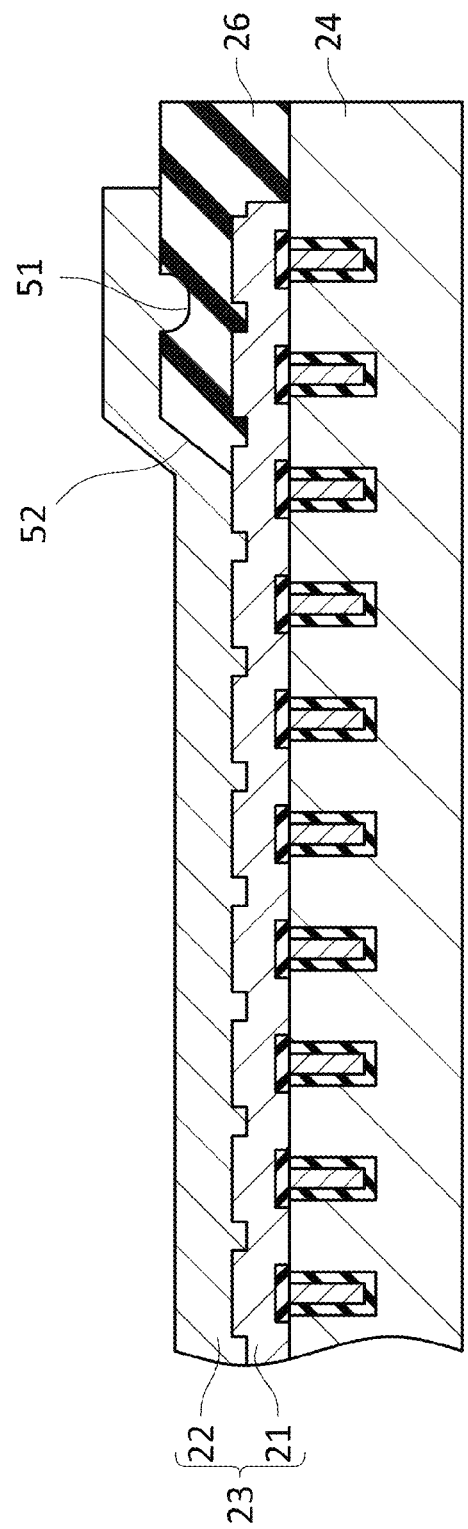
FIG. 7 is a view for explaining the manufacturing method of the semiconductor device according to the embodiment and showing the cross sectional view of the semiconductor device when a second metal film is formed on the first metal film and the protection film.

Firstly, as shown in FIG. 4, the first metal films 21 and the protection film 26 are deposited on the semiconductor substrate 24. The protection film 26 is deposited to cover the front surface of the semiconductor substrate 24 in a range not covered by the first metal films 21, and the first metal films 21. Next, as shown in FIG. 5, a resist 100 is formed. An opening 101 is provided in the resist 100 located above a range where the recess 51 of the protection film 26 is to be formed, and an opening 102 is provided in the resist 100 located above a range where each of the openings 52 is to be formed. A width of each opening 102 is wider than a width of the opening 101. Each opening 102 has a substantially square shape, and the opening 101 extends in a ring shape so as to surround the openings 102. Next, as shown in FIG. 6, the protection film 26 inside the openings 101 and 102 is removed by isotropic etching. Inside the openings 102, the first metal films 21 are exposed. Since the width of the opening 101 is narrower than the width of each opening 102, an etching rate is lower inside the opening 101 than inside the openings 102. Here, the etching is stopped before the first metal films 21 are exposed inside the opening 101. Thereby, the recess 51 is formed inside the opening 101. Thereafter, the resist 100 is removed. Next, as shown in FIG. 7, the second metal film 22 is deposited to cover the recess 51. Due to this, the configuration in which a part of the second metal film 22 is arranged in the recess 51 can be obtained.

In the above-described embodiment, the second metal film 22 is constituted of nickel. However, the second metal film 22 may be constituted of another metal which can be joined by soldering. For example, the second metal film 22 may be constituted of gold, silver, copper, tin, or the like. Further, in a case where the second metal film 22 is connected to an external device by means other than solder joint, the second metal film 22 may be constituted of a metal which cannot be joined by soldering.

Some of technical elements disclosed herein will be listed below. It should be noted that the respective technical elements are independent of one another, and are useful solely or in combinations.

In a configuration example disclosed herein, a recess extends in a ring shape so as to surround a center portion of a first metal film.

According to such a configuration, a second metal film can be suppressed from being detached from a protection film over its entire peripheral portion.

In a configuration example disclosed herein, a solder layer covering a front surface of the second metal film is further provided.

According to such a configuration, a higher stress is applied to the second metal film by the solder layer. Therefore, by providing the recess in the surface of the protection film, the second metal film is more effectively suppressed from being detached.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device, comprising:
   a semiconductor substrate;
   a first metal film covering a surface of the semiconductor substrate;
   a protection film covering a peripheral portion of a surface of the first metal film and including an opening in which a portion of the surface of the first metal film is located; and
   a second metal film covering a range extending across the portion of the surface of the first metal film located in the opening and a surface of the protection film,
   wherein
   a recess is provided in the surface of the protection film,
   a part of the second metal film is in contact with an inner surface of the recess, and
   the recess extends in a ring shape in a top view of the semiconductor device so as to surround the opening.

2. The semiconductor device of claim 1, further comprising a solder layer covering a surface of the second metal film.

* * * * *